US006953005B2

United States Patent
Suzuki

(12) United States Patent
(10) Patent No.: US 6,953,005 B2
(45) Date of Patent: Oct. 11, 2005

(54) PLASMA PROCESSING APPARATUS UTILIZING A SURFACE WAVE PLASMA

(75) Inventor: Masayasu Suzuki, Hadano (JP)

(73) Assignee: Shimadzu Corporation, Kyoto (JP)

( * ) Notice: Subject to any disclaimer, the term of this patent is extended or adjusted under 35 U.S.C. 154(b) by 65 days.

(21) Appl. No.: 10/767,977

(22) Filed: Jan. 29, 2004

(65) Prior Publication Data

US 2004/0183453 A1 Sep. 23, 2004

(30) Foreign Application Priority Data

Jan. 30, 2003 (JP) ........................................ 2003-022636
Apr. 30, 2003 (JP) ........................................ 2003-125052

(51) Int. Cl.$^7$ ............................................. C23C 16/00
(52) U.S. Cl. ....................... 118/723 AN; 118/723 MW
(58) Field of Search .................. 118/723 AN, 723 MW, 118/723 R; 156/345.41, 345.42, 345.48; 204/298.38, 398.39; 315/111.71, 111.41, 111.21

(56) References Cited

U.S. PATENT DOCUMENTS 6,388,632 B1 * 5/2002 Murakawa et al. ......... 343/770
6,620,290 B2 * 9/2003 Yamamoto et al. ..... 156/345.41
6,652,709 B1 * 11/2003 Suzuki et al. .......... 156/345.41

FOREIGN PATENT DOCUMENTS

JP           2000-348898          12/2000

* cited by examiner

*Primary Examiner*—Tuyet Thi Vo
(74) *Attorney, Agent, or Firm*—Rankin, Hill, Porter & Clark LLP

(57) ABSTRACT

A dielectric window performs three functions, namely, (1) extraction of a microwave, (2) generation and transmission of a surface wave, and (3) keeping the vacuum. An O-ring, which keeps the vacuum between the dielectric window and a chamber, is arranged so as to surround the vicinity of a bottom plate 1$a$ of a microwave waveguide. Dielectric plates area arranged in parallel with each other in the dielectric window and performs only the transmission of a surface wave. The dielectric plates may be different from the dielectric window in at least one of a shape, a thickness, and a dielectric constant.

8 Claims, 9 Drawing Sheets

PLASMA PROCESSING APPARATUS UTILIZING A SURFACE WAVE PLASMA

BACKGROUND OF THE INVENTION

1. Field of the Invention

The present invention relates to a plasma processing apparatus using a surface wave plasma.

2. Description of the Related Art

Plasma technique has been heretofore often used in semiconductor manufacturing processes for coating, etching, ashing, and the like. In addition, the plasma technique has been also used for manufacturing solar cells, liquid crystal displays, plasma displays, and the like. Recently, in accordance with the increase in size of a panel or a screen, a plasma processing technique of a large area has become important. For this purpose, it is necessary to generate a plasma which is large and has a uniform plasma density. If the plasma density is uniform, uniform plasma processing can be applied to an entire surface of a substrate.

As a plasma processing apparatus which can generate a large plasma, there is an apparatus using a surface wave plasma (SWP) (e.g., see JP-A-2000-348898 (page 2, FIG. 1)). In this apparatus, microwaves being transmitted the inside of a waveguide are introduced into a plasma generating chamber from a slot antenna through a dielectric window (microwave transmitting window) so that a process gas in the plasma generating chamber is excited by surface waves generated at a surface of the dielectric window facing the plasma generating chamber to thereby generate a plasma. Since the surface waves are transmitted on the plasma generating in chamber of the dielectric window promptly, the plasma tends to expand, and a large plasma area can be obtained easily.

In this type of a plasma processing apparatus, plasma processing is performed while a pressure in a vacuum chamber (that ism the plasma generating chamber) is kept at about 0.1 to 50 Pa. In order to maintain this decompressed atmosphere, a vacuum seal is applied in a place close to an external circumference of the dielectric window.

In the case in which the vacuum seal is applied in the place close to the external circumference of the dielectric window, a maximum stress is loaded in a central part of the dielectric window. As described above, an area of the dielectric window has to be increased in order to obtain a plasma of a large area. When the area of the dielectric window is increased, the maximum stress increases more. Therefore, it is necessary to replace a material of the dielectric window with a material having a high strength or to increase a thickness of the dielectric window.

However, a high-strength dielectric material such as aluminum or zirconia has a disadvantage that it is expensive and hard to be processed. On the other hand, it is not desirable to increase the thickness of the dielectric window because its own weight and material costs increase or it becomes susceptible to thermal shock due to a plasma.

SUMMARY OF THE INVENTION

An object of the present invention is to provide a plasma processing apparatus which can generate a plasma of a large area without increasing a thickness and material cost of a dielectric window.

(1) A plasma processing apparatus according to a first aspect of the present invention is a plasma processing apparatus comprising:

a microwave waveguide which is provided with slot antennas on a bottom plate thereof;

a microwave transmitting window which is arranged so as to be opposed to the bottom plate, extracts a microwave through the slot antennas, and generates and transmits a surface wave;

a dielectric plate which is provided in parallel with the microwave transmitting window and transmits the surface wave;

a vacuum chamber in which a plasma is generated by the surface wave; and a seal member which is arranged between the vacuum chamber and the microwave transmitting window so as to surround the circumference of the bottom plate.

In the above-mentioned plasma processing apparatus, it is preferable that the seal member is arranged with a minimum area which can surround the circumference of the bottom plate.

In the above-mentioned plasma processing apparatus, the dielectric plate may be different from the microwave transmitting window in at least one of a shape, a thickness, and a dielectric constant.

(2) In the above-mentioned plasma processing apparatus, it is preferable that at least one of the microwave transmitting window and the dielectric plate is divided in a plate thickness direction.

Moreover, it is preferable that the microwave transmitting window is divided in a plate surface except at least a microwave transmitting window which is in contact with the bottom plate.

DETAILED DESCRIPTION OF THE INVENTION

The plasma processing apparatus according to the present invention will be hereinafter described with reference to the accompanying drawings.

(First Embodiment)

Figure 1A:
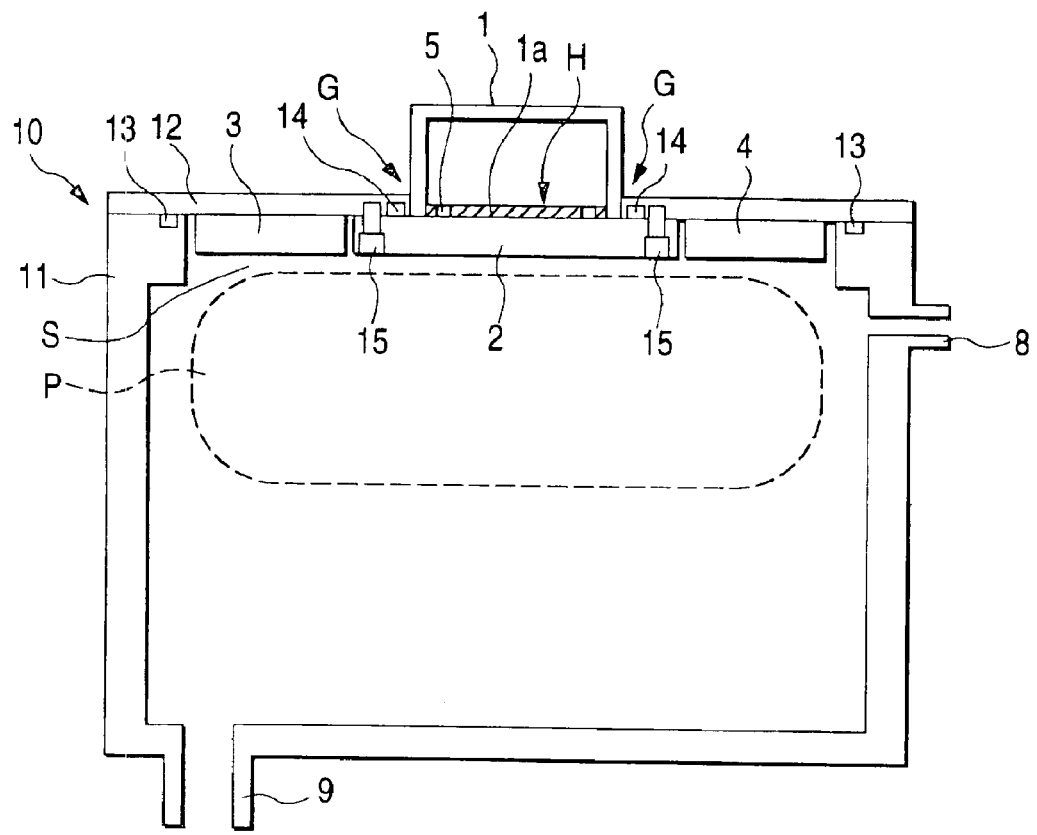
FIG. 1A is a longitudinal sectional view perpendicular to an incident direction of microwaves which schematically shows a plasma processing apparatus in accordance with a first embodiment of the present invention.
Figure 1B:
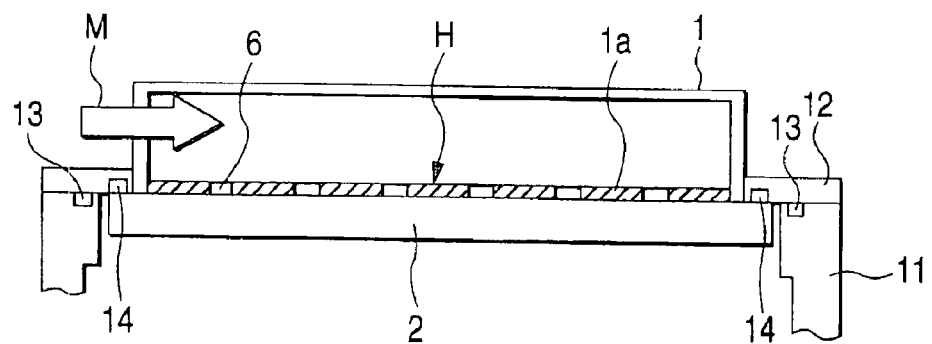
FIG. 1B is a partial longitudinal sectional view parallel to the incident direction of the microwaves which schematically shows the plasma processing apparatus in accordance with the first embodiment of the present invention.
Figure 2:
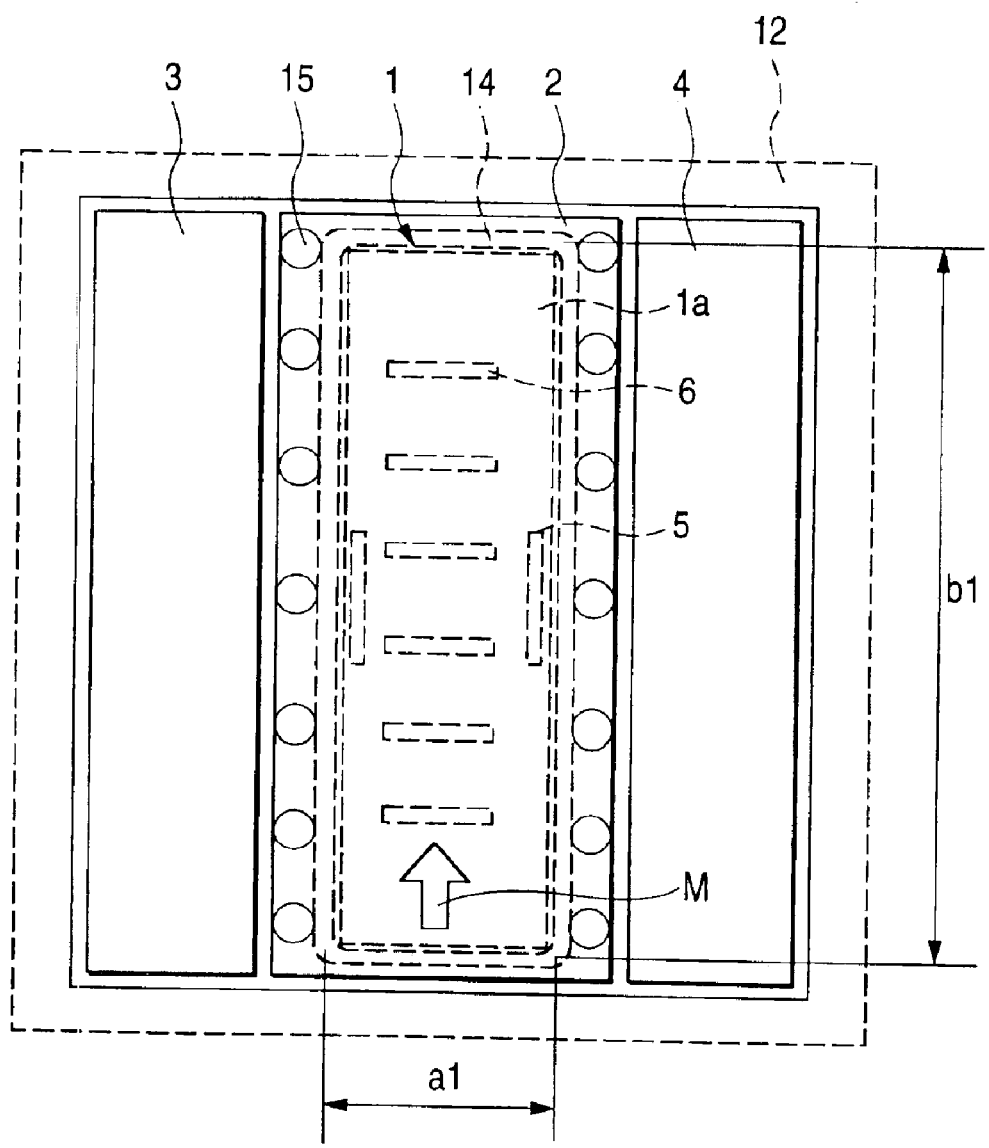
FIG. 2 is a view showing a dielectric plate of the plasma processing apparatus in accordance with the first embodiment of the present invention and a peripheral structure thereof viewed from an inner side of a chamber.

FIGS. 1A and 1B are overall diagrams schematically showing a plasma processing apparatus according to an embodiment of the present invention. FIG. 1A is a longitudinal sectional view perpendicular to an incident direction of microwaves, and FIG. 1B is a partial longitudinal sectional view parallel to the incident direction of the microwaves. FIG. 2 is a view of a dielectric plate according to the embodiment and a peripheral portion thereof viewed from an inner side of a chamber.

The plasma processing apparatus shown in FIGS. 1A and 1B and FIG. 2 includes a microwave waveguide 1, a dielectric window 2, dielectric plates 3 and 4, and a chamber 10. The dielectric plates 3 and 4 are arranged adjacent to the dielectric window 2. The dielectric window 2 and the dielectric plates 3 and 4 are dielectric members, which are processed from a dielectric material such as quartz, aluminum, zirconia, Pyrex glass (registered trademark), or Teflon (registered trademark). In this embodiment, a portion of the dielectric member through which microwaves passes (or a portion above which slot antennas are disposed) is defined as the dielectric window and a portion of the dielectric member along which a surface wave is transmitted is defined as the dielectric plate.

Slot antennas 5 and 6, which guide microwaves M to the dielectric window 2, are formed on a bottom plate 1a of the microwave waveguide 1. In this embodiment, the slot antennas 5 are provided with a plurality of long apertures extending in an incident direction of the microwaves M. The slot antennas 6 are provided with a plurality of long apertures extending in a direction substantially perpendicular to the incident direction of the microwaves M.

The microwaves M with a frequency of, for example, 2.45 GHz, which are generated from a not-shown microwave output portion, are transmitted the inside of the microwave waveguide 2 to form a standing wave. The microwaves M pass through the dielectric window 2 via the slot antennas 5 and 6, whereby a surface wave S is generated at a surface of the dielectric window 2. The surface wave S is transmitted the surface on the chamber 10 side of the dielectric plate 2. Then, the surface wave S is transmitted the dielectric plates 3 and 4 adjacent to the dielectric plate 2 and instantly spreads to the entire surface of the dielectric window 2 and the dielectric plates 3 and 4. This surface wave energy excites a process gas, which is introduced into the chamber 10, to generate a plasma P. A transmitted area of the surface wave S is substantially equal to a total area of the dielectric window 2 and the dielectric plates 3 and 4. Thus, an area of the plasma P is also substantially equal to the total area of the dielectric window 2 and the dielectric plates 3 and 4.

A gas introduction port 8 and a pumping port 9 are provided in the chamber 10. A process gas such as $O_2$, $SiH_4$, $H_2$, $N_2$, $SF_6$, $Cl_2$, Ar, TEOS or He is introduced from the gas introduction port 8. The air is pumped out of the pumping port 9 while the process gas is introduced, whereby a pressure in the chamber 10 is usually maintained at about 0.1 to 50 Pa. The plasma P is generated by the surface wave energy in such a vacuum. Although not illustrated, a substrate is placed in the plasma P, whereby processing such as coating, etching, or ashing is performed.

Here, to keep a vacuum of chamber or create a vacuum of chamber 10 will be described. The chamber 10 consists of a chamber body 11 and a flange 12. Both the chamber body 11 and the flange 12 are made of nonmagnetic metal such as stainless steel, aluminum, or aluminum alloy. An O-ring 13 is fit in a groove formed in the chamber body 11 and is elastically deformed by a force, which is caused by pressing the chamber body 11 and the flange 12 against each other, to keep the vacuum between the chamber body 11 and the flange 12.

On the other hand, as shown in FIG. 1, only an area, in which the bottom plate 1a of the microwave waveguide 1 is placed, of the flange 12 is cut away from the necessity of conducting the microwave M to the dielectric window 2. The bottom plate 1a of the microwave waveguide 1 and the dielectric window 2 are directly in contact with each other. Therefore, the vacuum keeping the chamber 10 from a gap G between the microwave waveguide 1 and the flange 12 has to be blocked. In addition, the vacuum keeping the chamber 10 from apertures of the slot antennas 5 and 6 also has to be blocked.

For that purpose, the vacuum is kept by an O-ring 14 between the flange 12 and the dielectric window 2. The O-ring 14 is fit in a groove formed in the flange 12. Note that the flange groove can be formed in the dielectric window 2. The dielectric window 2 is attached to the flange 12 by bolts 15. The O-ring 14 is elastically deformed by a force, which is caused by pressing the dielectric window 2 against the flange 12 to keep the vacuum between the dielectric window 2 and the flange 12.

As a result, the vacuum of the chamber 10 is kept by the O-rings 13 and 14 which are seal members.

As shown in FIG. 1A, the dielectric plates 3 and 4 are arranged adjacent to the dielectric window 2 on the left and right thereof, respectively. The dielectric plates 3 and 4 are not involved in keeping the vacuum. Note that, although not illustrated, the dielectric plates 3 and 4 are also attached to the flange 12 by bolts or the like.

The O-ring 14 is arranged so as to surround the bottom plate 1a of the microwave waveguide 1 in the vicinity of the external circumference of the dielectric window 2. Since the O-ring 14 is arranged in this way, the entire gap G and apertures of the slot antennas 5 and 6 are covered, and the vacuum of the chamber 10 is kept.

In addition, it is also possible to realize a structure in which the bottom plate 1a of the microwave waveguide 1 and the flange 12 are integrated and the gap G does not exist. In this case, the O-ring 14, which keeps the vacuum between the dielectric window 2 and the flange 12, only has to be arranged so as to surround at least all the apertures of the slot antennas 5 and 6. In this case, the area with which the O-ring 14 surrounds the circumference of the bottom plate 1a is minimized.

The dielectric window 2 supports the atmospheric pressure in this portion of the O-ring 14. As described earlier, since the pressure in the chamber 10 is about 0.1 to 50 Pa, a pressure difference, which the dielectric window 2 is subjected to, can be regarded as one atm.

Here, with reference to FIGS. 3A and 3B, it will be explained how high stress is supported by the dielectric window 2.

Figure 3A:
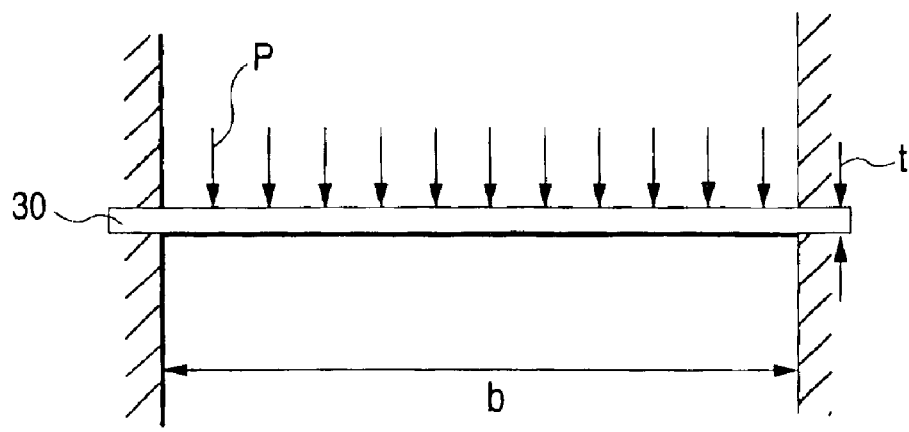
FIGS. 3A and 3B are schematic diagrams for explaining a stress loaded on a flat plate by a uniformly distributed load.
Figure 3B:
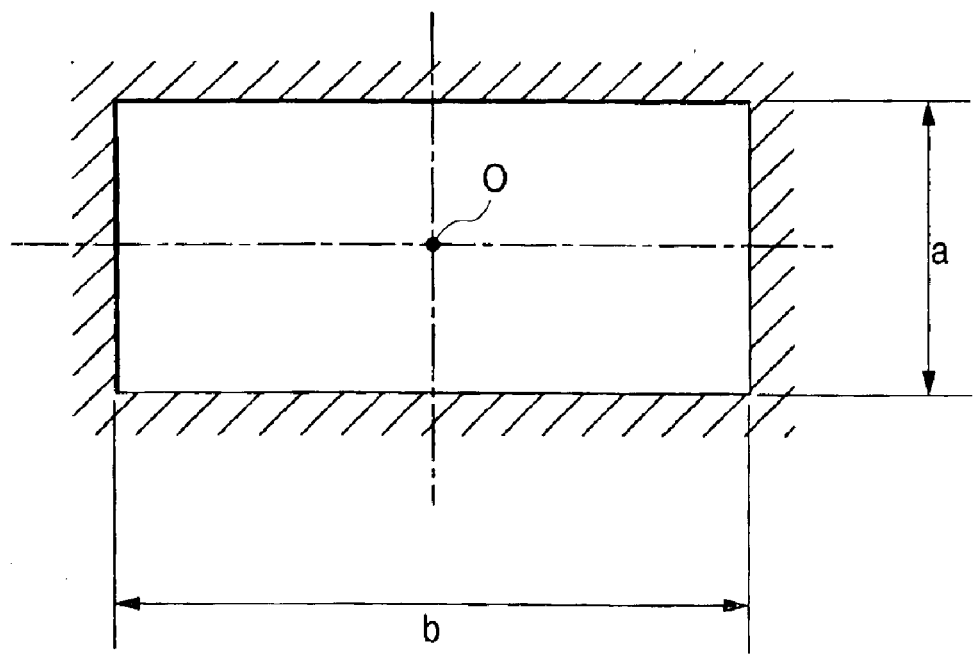

FIGS. 3A and 3D are schematic diagrams for explaining a stress loaded on a flat plate by the atmospheric pressure. In general, a uniformly distributed load p acts on a flat plate 30, which is used as a partition between the atmosphere and the vacuum, under the atmospheric pressure p. When it is assumed that an area of the flat plate is a×b and a plate thickness is t, a maximum stress is loaded in a central part O of the flat plate. A maximum stress σ is represented by the following expression. Here, β is a constant depending upon b/a and is larger than 0.3 and smaller than 0.5.

[Numeral 1]

$$\sigma = \beta p^* a^2 / t^2 \quad (1)$$

A maximum stress σ1, which is loaded in the dielectric window 2 of FIG. 2, will be calculated using expression 1. In the O-ring 14 arranged in substantially a rectangular shape as shown in FIG. 2, it is assumed that a length of a side perpendicular to the incident direction of the microwaves M is a1, and a length of a side parallel with the incident direction is b1. When it is assumed that dimensions a1, b1, and t of the O-ring 14 of the dielectric window 2 are 0.18 m, 1 m, and 0.02 m, respectively, β is equal to 0.5. The dimension a1 of 0.18 m is a dimension which is set with a width 109.2 mm of the microwave waveguide 1 as a reference. When these numerals are substituted for β, a, and t in expression 1, σ1 is equal to 40.5 p.

Figure 4A:
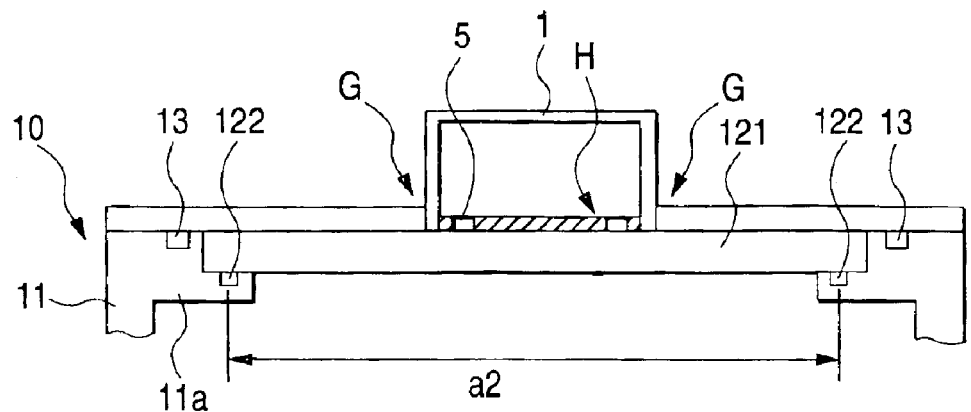
FIG. 4A is a partial longitudinal sectional view perpendicular to an incident direction of microwaves which schematically shows a dielectric window and an O-ring of a related-art plasma processing apparatus.
Figure 4B:
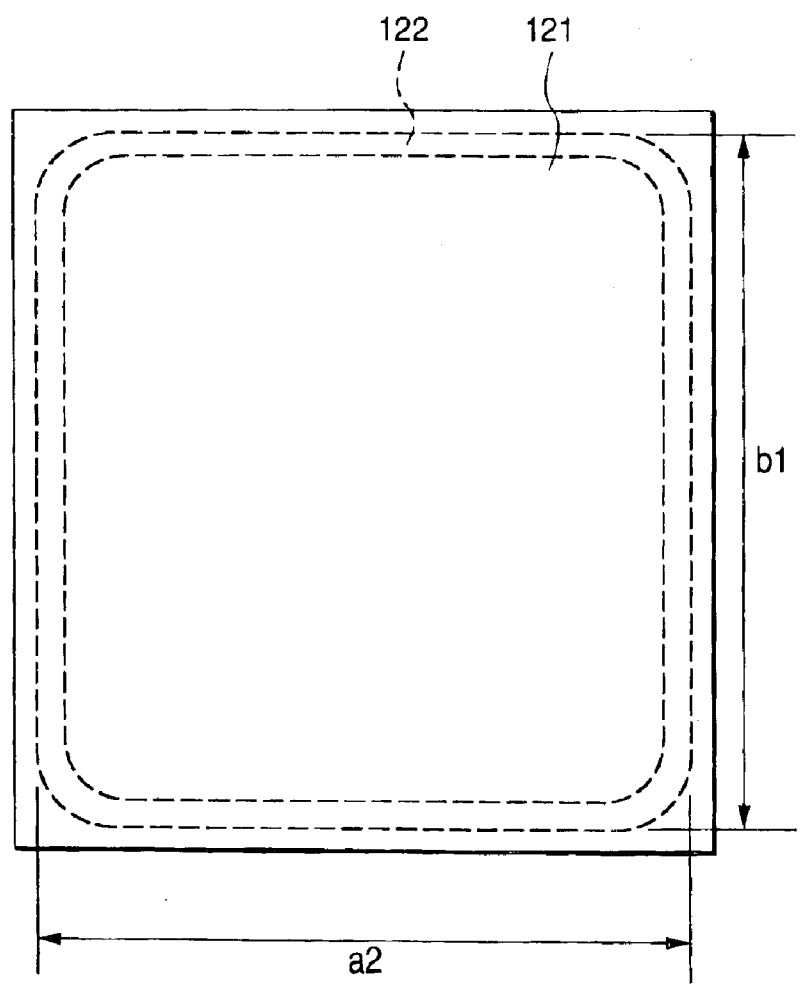
FIG. 4B is a view of the dielectric window and the O-ring viewed from the chamber side which schematically shows the dielectric window and the O-ring of the related-art plasma processing apparatus.

Next, a maximum stress, which is loaded in a related-art dielectric window shown in FIGS. 4A and 4B, will be calculated in order to compare it with the maximum stress, which is loaded in the dielectric window 2 of this embodiment.

FIGS. 4A and 4B are schematic views showing a dielectric window and an O-ring of a related-art plasma processing apparatus. FIG. 4A is a partial longitudinal sectional view perpendicular to an incident direction of microwaves, and corresponds to FIG. 1A. In addition, FIG. 4B is a bottom view and corresponds to FIG. 2. In the corresponding views, the identical components are denoted by the identical reference numerals and signs, and the description of the components is omitted.

The dielectric window 121 supports the atmospheric pressure in a portion of an O-ring 122. It is assumed that the total area of the dielectric window 2 and the dielectric plates 3 and 4 of this embodiment and an area of a dielectric window 121 are the same. In addition, it is assumed that the thickness of the dielectric window 2 and the dielectric plates 3 and 4 and a thickness of the dielectric window 121 are the same. When it is assumed that dimensions a2, b1, and t of the O-ring 122 of the dielectric window 121 are 1 m, 1 m, and 0.02 m, respectively, β is equal to 0.3. When these numerals are substituted for β, a, and t in expression 1, a maximum stress σ2, which is loaded in the dielectric window 121, is equal to 750 p.

When the maximum stress σ1, which is loaded in the dielectric window 2 of this embodiment, and the maximum stress σ2, which is loaded in the related-art dielectric window 121, are compared, σ1 is only about 1/18 of σ2. In other words, in the case in which the dielectric window 2 and the dielectric window 121 are subjected to an identical uniformly distributed load, since a maximum stress is inversely proportional to a square of a plate thickness, the dielectric window 2 only has to have a thickness of about 1/4 of the dielectric window 121. If the area with which the O-ring 14 surrounds the bottom plate 1a of the microwave waveguide 1 is reduced, the area of the dielectric window 2 can be reduced accordingly. By reducing the area of the dielectric window 2, its thickness and its own weight can be reduced.

Note that, since the dielectric plates 3 and 4 are in the chamber 10 and are not exposed to the atmosphere, no stress due to the atmospheric pressure is loaded on the dielectric plates 3 and 4.

The dielectric window 2 performs three functions, namely, (1) extraction of a microwave, (2) generation and transmission of a surface wave, and (3) keeping the vacuum. On the other hand, the dielectric plates 3 and 4 perform only the transmission of the surface wave. Since a structure with the dielectric plates 3 and 4 added to the dielectric window 2 is adopted in this way, as a result, the same function as a dielectric window of a large area can be obtained. In other words, a surface wave plasma of a large area can be generated.

The number of the dielectric plates 3 and 4 is not limited to two but may be one. Three or more dielectric plates may be arranged one after another. In this way, an area of dielectric plates can be selected freely.

In addition, the dielectric plates 3 and 4 maybe different from the dielectric window 2 in a shape, a thickness, and a dielectric constant thereof.

Figure 5A:
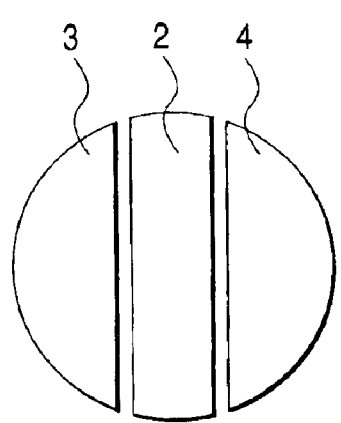
FIGS. 5A and 5B are schematic diagrams illustrating dielectric windows and dielectric plates having shapes and thicknesses different from each other in the plasma processing apparatus in accordance with the embodiment of the present invention.
Figure 5B:
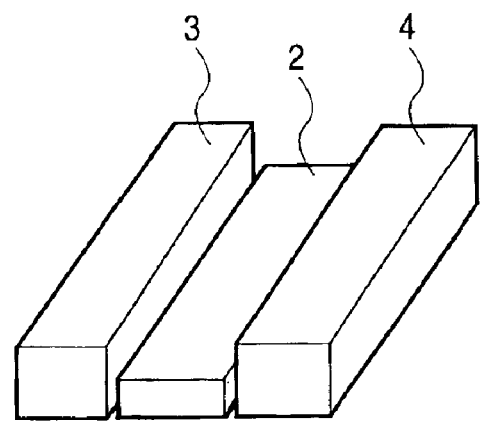

FIGS. 5A and 5B are schematic diagrams illustrating dielectric windows and dielectric plates having shapes and thicknesses different from each other. FIG. 5A shows a structure in which the dielectric window 2 and the dielectric plates 3 and 4 have different shapes and forms a circular plate as a whole. In addition, although not illustrated, the dielectric window 2 and the dielectric plates 3 and 4 may be formed in a shape with a thickness of a peripheral portion of the circular plate increased, a so-called cup shape.

FIG. 5B shows a structure in which the dielectric window 2 and the dielectric plates 3 and 4 are combined, and have the same rectangular shape and different plate thicknesses. In addition, although not illustrated, the dielectric window 2 and the dielectric plate 3 may be formed in a combined shape, a so-called L shape.

It goes without saying that the dielectric window 2 and the dielectric plates 3 and 4 of a structure, in which the structures of FIGS. 5A and 5B are combined and both the shapes and the plate thicknesses thereof are different, can also be used. Moreover, the dielectric window 2 and the dielectric plates 3 and 4 of a structure, in which the dielectric constants thereof are different in addition to the shapes and the plate thicknesses, can also be used.

As described above, the dielectric window and the dielectric plates with different shapes, thicknesses, and dielectric constants can be used. Thus, it is possible to easily change a shape of the plasma P and adjust a plasma density distribution.

(Second Embodiment)

A second embodiment will be hereinafter described with reference to FIGS. 6A to 9.

Figure 6A:
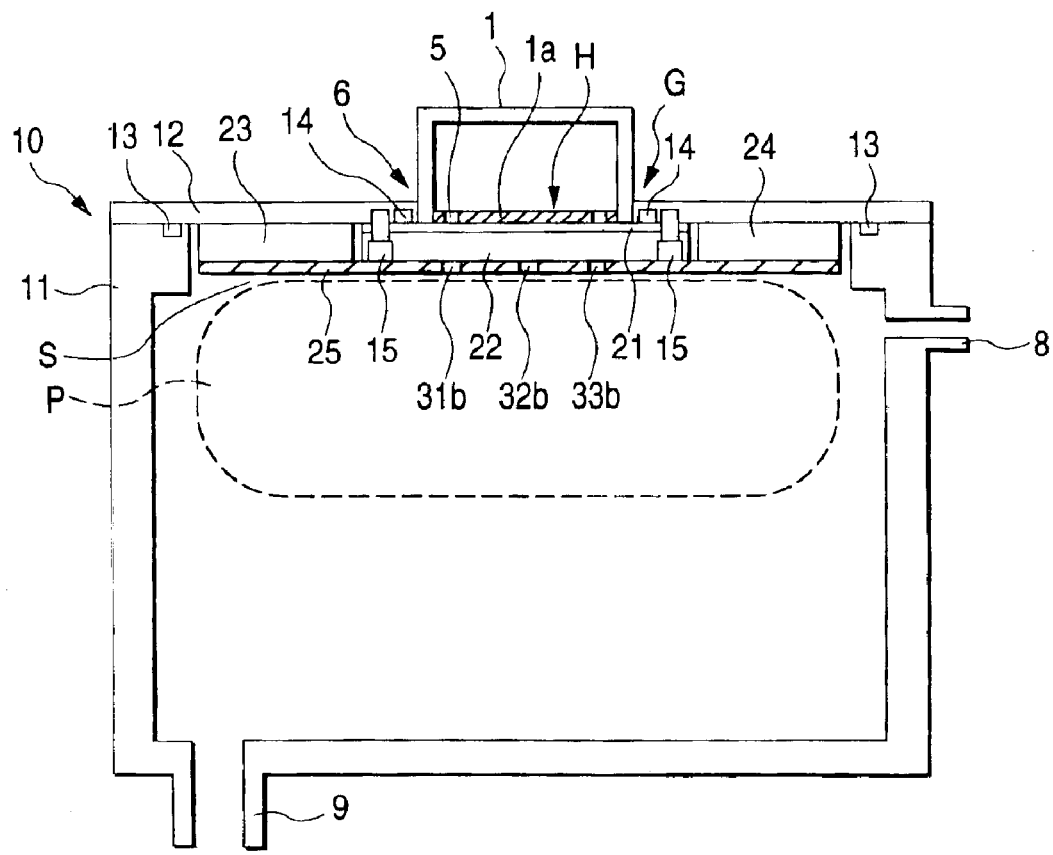
FIG. 6A is a longitudinal sectional view perpendicular to an incident direction of microwaves which schematically shows a plasma processing apparatus in accordance with a second embodiment of the present invention.
Figure 6B:
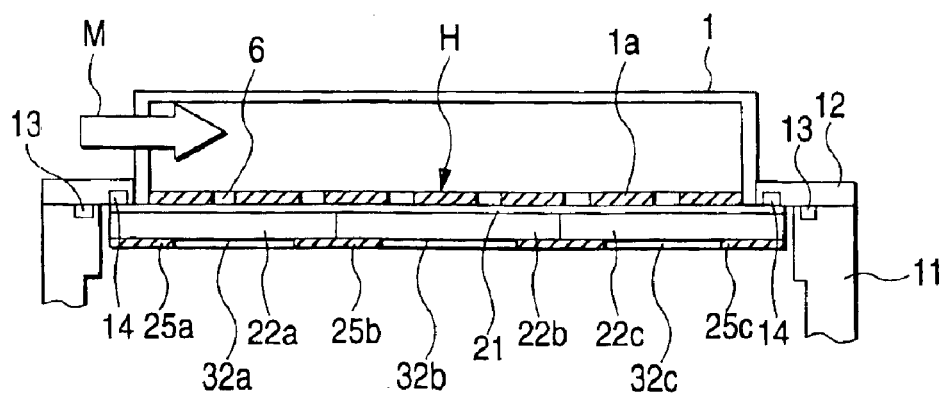
FIG. 6B is a partial longitudinal sectional view parallel to the incident direction of the microwaves which schematically shows the plasma processing apparatus in accordance with the second embodiment of the present invention.
Figure 7:
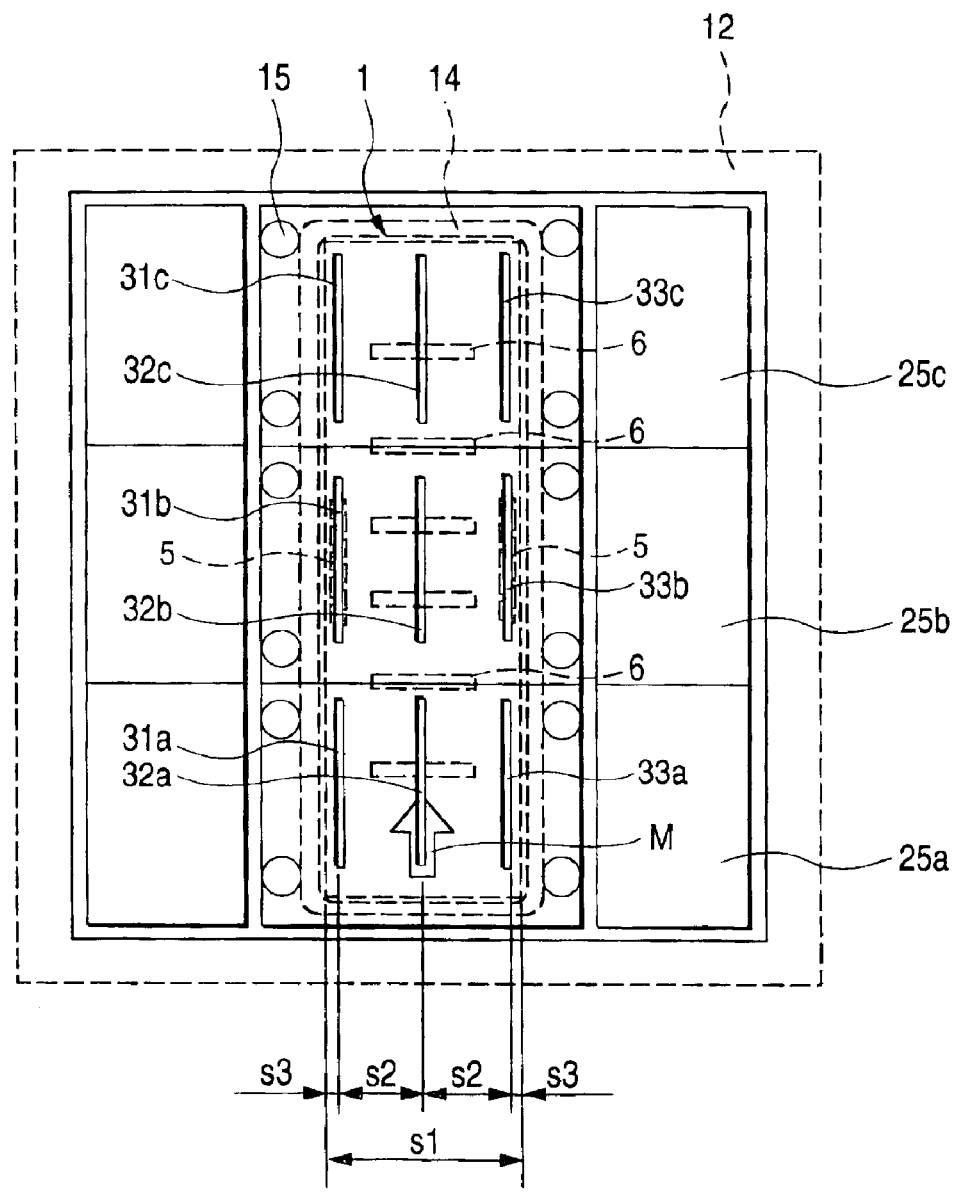
FIG. 7 is a view of a dielectric plate of the plasma processing apparatus in accordance with the second embodiment of the present invention and a peripheral structure thereof viewed from an inner side of a chamber.

FIGS. 6A and 6B are overall diagrams schematically showing a plasma processing apparatus according to this embodiment. FIG. 7 is a view of a dielectric window and dielectric plates according to this embodiment and a peripheral portion thereof viewed from the inside of a chamber. Since FIGS. 6A and 6B and FIG. 7 are views corresponding to FIGS. 1A and 1B and FIG. 2, respectively, the same components are denoted by the identical reference numerals and signs, and differences will be mainly described.

Figure 8:
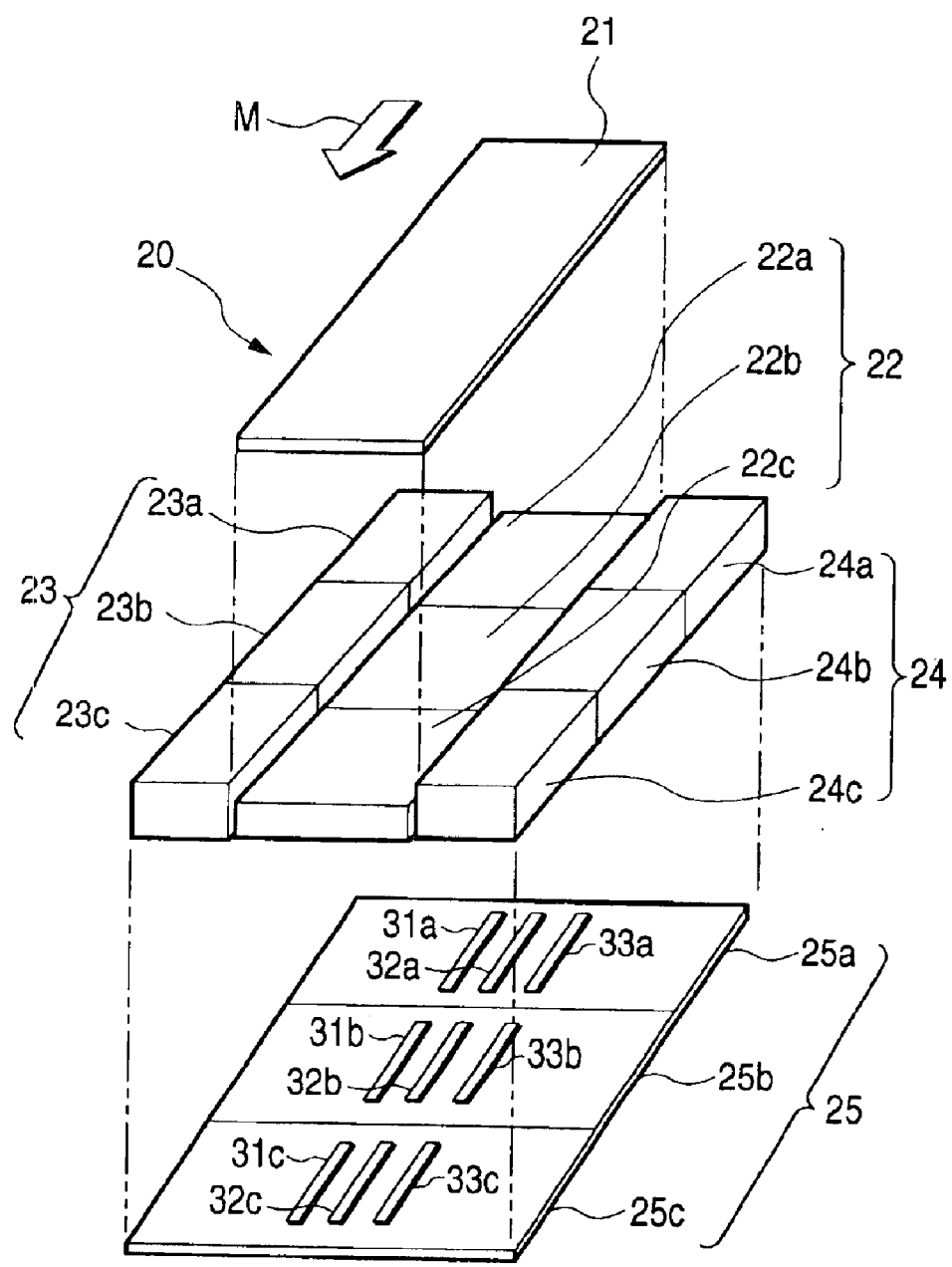
FIG. 8 is a perspective view showing a divided shape of a dielectric window and dielectric plates in the plasma processing apparatus in accordance with the second embodiment of the present invention.

FIG. 8 is a perspective view showing a divided shape of the dielectric window and the dielectric plates in the plasma processing apparatus according to this embodiment.

Figure 9:
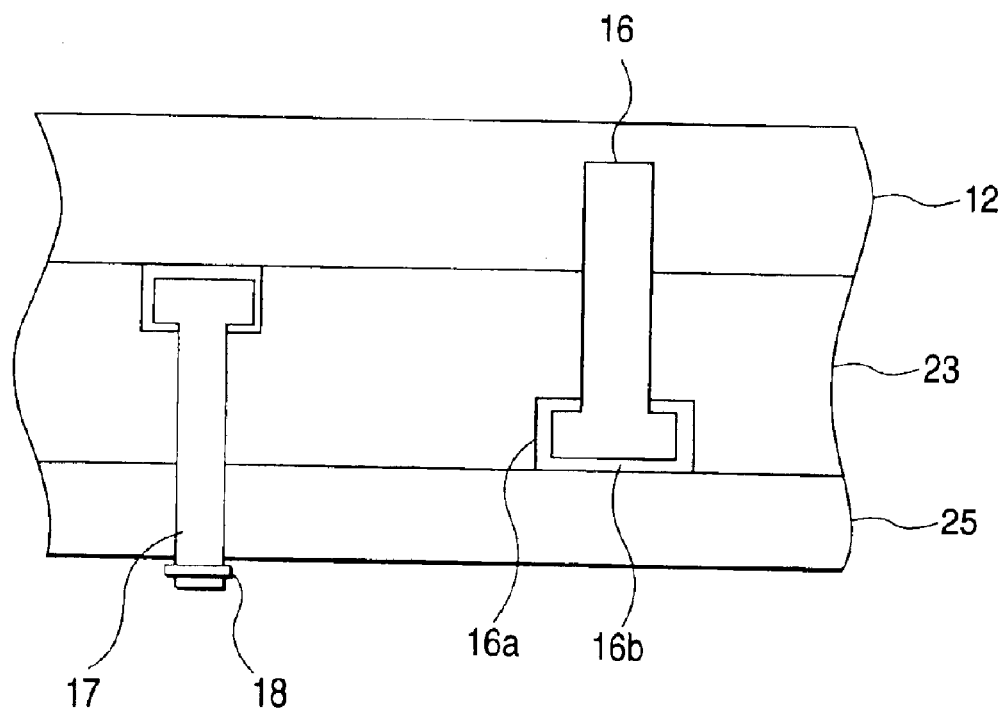
FIG. 9 is a partial sectional view for explaining an attached state of the dielectric plates in accordance with the second embodiment of the present invention.

FIG. 9 is a partial sectional view for explaining an attached state of the dielectric plates according to this embodiment.

In the plasma processing apparatus according to this embodiment, the dielectric window and the dielectric plates shown in FIG. 8 are used.

In FIG. 8, reference numeral 20 denotes a divided structure in which the dielectric window and the dielectric plates are divided and combined, respectively. The divided structure 20 has a dielectric window 21, a dielectric window 22, dielectric plates 23 and 24, and dielectric lower plates 25. The dielectric window 22 is divided into three dielectric windows 22a to 22c, and the dielectric plates 23 and 24 are divided into three dielectric plates 23a to 23c and dielectric plates 24a to 24c, respectively. The dielectric lower plates 25 is also divided into three dielectric lower plates 25a to 25c, and slits 31a to 31c, 32a to 32c, and 33a to 33c are formed in an area thereof in contact with the dielectric window 22. In other words, in the divided structure 20, the structure consisting of the dielectric window 2 and the dielectric plates 3 and 4 of the first embodiment is divided in the plate thickness direction and in the plate surface.

In FIGS. 6 and 7, the dielectric window 22 divided into three has two boundaries, which are located at positions where the slot antennas 6 are disposed, respectively. Similarly, two boundaries of each of the dielectric plates 23 and 24 and the dielectric lower plate 25 are also located at positions where the slot antennas 6 are disposed.

Concerning the slits of the dielectric lower plate 25, since FIG. 7 is a view of the dielectric window and the dielectric plates viewed from the bottom thereof, the slits 31a to 31c are located on the left, the slit 32a to 32c are located in the center, and the slits 33a to 33c are located on the right. The slits 31b and 33b are located at positions the slot antennas 5 are disposed.

A positional relation and dimensions of the slits 31, 32, and 33a will be described as follows with reference to FIG. 7. Reference signal s1 denotes a width of the microwave waveguide 1. Reference sign s2 denotes a distance between the slits 31a and 32a as well as a distance between the slits 32a and 33a. Reference sign s3 denotes a distance between one side of the microwave waveguide 1 and the slit 31a as well as a distance between the other side and the slit 33a. s3 is in a range of 5 to 12 mm. A length and a width of the slits 31a, 32a, and 33a are 70 to 100 mm and 0.1 to 1.0 mm, respectively. The length and the width are the same for the slits 31b, 32b, 33b, 31c, 32c, and 33c.

The dielectric window 21 is a thin monolithic plate which extracts the microwave M and keeps the vacuum in the chamber 10. A plate thickness equivalent to that of the dielectric window 2 is a total of the plate thicknesses of the dielectric window 21, the dielectric window 22, and the dielectric lower plate 25. A plate thickness equivalent to that of the dielectric plate 3 provided in parallel with the dielectric window 2 is a total of the plate thicknesses of the dielectric plate 23 and the dielectric lower plate 25. A plate thickness equivalent to that of the dielectric plate 4 is a total of the plate thicknesses of the dielectric plate 24 and the dielectric lower plate 25.

Actions and advantages will be described concerning the divided structure 20 in the plasma processing apparatus of the second embodiment constituted as described above will be described.

During generation of the plasma P, a dielectric window or dielectric plates are affected by heats. One is a radiant heat from the plasma P, and another is self-heating due to a dielectric loss which is proportional to a dielectric constant and a dielectric loss tangent tanδ of a dielectric. An internal stress is generated in the dielectric window or the dielectric plates.

A temperature gradient, which is generated in the plate thickness direction, is reduced in the individual dielectric window or dielectric plate by dividing them in the plate thickness direction. Thus, the internal stress generated by the heats can be reduced. In particular, a thin dielectric plate is used for the dielectric lower plate 25 which is exposed to high temperature of the plasma P, whereby an advantage of reducing the internal stress is increased.

An amount of thermal expansion due to the radiant heat and the self-heating is reduced in the individual dielectric window or dielectric plate by dividing them in the plate surface. In addition, the amount of thermal expansion can be absorbed in a slight gap of an interface between the dielectric windows adjacent to each other or the dielectric plates adjacent to each other, whereby the internal stress can be released. Further, the slits formed in the dielectric lower plate 25 also absorbs the amount of thermal expansion, whereby the internal stress can be released.

In particular, since an increase in temperature is high in the vicinity of the slot antennas 6 and 5, if the splits and the slits are located at positions where the slot antennas 6 and 5 are disposed, respectively, the advantage of releasing the internal stress is increased. Note that, since it is necessary to keep the vacuum in the chamber 10, the dielectric window 21, which is in direct contact with the bottom plate 1a of the microwave waveguide 1, is not divided in the plate surface.

In order to reduce the self-heating due to the dielectric loss, it is desirable to use a material with a small dielectric constant. In particular, if a material with a relatively small dielectric constant is used as a material of the dielectric lower plate 25 which is directly exposed to the plasma P, the advantage of reducing the self-heating is increased. In this case, a material of the dielectric window 22, the dielectric plates 23 and 24, and the dielectric window 2 may be different from the material of the dielectric lower plate 25.

According to this embodiment, a plasma of a large area can be generated easily, an internal stress, which is generated in dielectric windows and dielectric plates due to the influence of heats, can be reduced, and damage to the dielectric windows and the dielectric plates can be prevented.

Next, with reference to FIG. 9, an example of a method of mounting the divided structure 20 to the plasma processing apparatus will be described.

The dielectric plate 23 is screwed to the flange 12 by a bolt 16. A bored hole 16a is provided in the dielectric plate 23. No problem is caused if a dielectric material is used for the bolt 16. However, for example, if stainless steel is used, it is likely that the transmission of a surface wave is hindered. In this case, it is sufficient to provide a dielectric material such as Teflon, polyimide or alumina in a gap between the bored hole 16a and the bolt 16.

The dielectric lower plate 25 is suspended from the dielectric plate 23 by a bolt 17 and a pin 18. The pin 18 pierces the bolt 17 in a radial direction thereof. The bolt 17 and the pin 18 are made of a dielectric material. If tips of the bolt 17 and the pin 18 project from the lower surface of the dielectric lower plate 25, it is likely that the transmission of a surface wave is hindered. In order to avoid this likelihood, it is sufficient to provide a recessed portion in the dielectric lower plate 25 and contain the tip of the bolt 17 and the pin 18 in this recessed portion.

As described above, according to the present invention, a plasma processing apparatus, which generates a plasma of a large area easily, can be provided.

What is claimed is:

1. A plasma processing apparatus comprising:
    a microwave waveguide which is provided with slot antennas on a bottom plate thereof;
    a microwave transmitting window which is arranged so as to be opposed to the bottom plate for extracting a microwave through the slot antennas, generating and transmitting a surface wave;
    a dielectric plate which is provided in parallel with the microwave transmitting window for transmitting the surface wave;
    a vacuum chamber in which a plasma is generated by the surface wave; and
    a seal member which is arranged between the vacuum chamber and the microwave transmitting window so as to surround the circumference of the bottom plate.

2. The plasma processing apparatus according to claim 1, wherein the dielectric plate is different from the microwave transmitting window in at least one of a shape, a thickness, and a dielectric constant.

3. The plasma processing apparatus according to claim 1, wherein the dielectric plate is divided in a plate surface.

4. The plasma processing apparatus according to claim 1, wherein the seal member is arranged with a minimum area which can surround the circumference of the bottom plate.

5. The plasma processing apparatus according to claim 4, wherein the dielectric plate is different from the microwave transmitting window in at least one of a shape, a thickness, and a dielectric constant.

6. The plasma processing apparatus according to claim 1, wherein at least one of the microwave transmitting window and the dielectric plate is divided in a plate thickness direction.

7. The plasma processing apparatus according to claim 6, wherein the microwave transmitting window is divided in a plate surface except at least a microwave transmitting window which is in contact with the bottom plate.

8. The plasma processing apparatus according to claim 6, wherein the dielectric plate is divided in a plate surface.

* * * * *